United States Patent [19]
Chang et al.

[11] Patent Number: 5,686,329
[45] Date of Patent: Nov. 11, 1997

[54] METHOD FOR FORMING A METAL OXIDE SEMICONDUCTOR FIELD EFFECT TRANSISTOR (MOSFET) HAVING IMPROVED HOT CARRIER IMMUNITY

[75] Inventors: Ming-Hsung Chang, Hsin-Chu; J. W. Wang, Chai-Chi, both of Taiwan

[73] Assignee: Taiwan Semiconductor Manufacturing Company, Ltd., Hsin-Chu, Taiwan

[21] Appl. No.: 581,144

[22] Filed: Dec. 29, 1995

[51] Int. Cl.⁶ .................................................. H01L 21/265
[52] U.S. Cl. ........................... 437/41 RLD; 437/40 SW; 437/41 SW; 437/44; 437/919
[58] Field of Search ........................ 437/29, 40 SW, 437/41 RLD, 44, 41 SW, 919

[56] References Cited

U.S. PATENT DOCUMENTS

| | | | |
|---|---|---|---|
| 5,013,675 | 5/1991 | Shen et al. | 437/41 RLD |
| 5,091,763 | 2/1992 | Sanchez | 437/41 RLD |
| 5,173,437 | 12/1992 | Chi | 437/60 |
| 5,279,979 | 1/1994 | Shino et al. | 437/40 SW |
| 5,338,701 | 8/1994 | Hsu et al. | 437/60 |
| 5,356,826 | 10/1994 | Natsume | 437/60 |

*Primary Examiner*—Trung Dang
*Attorney, Agent, or Firm*—George O. Saile; Stephen B. Ackerman; Alek P. Szecsy

[57] ABSTRACT

A Metal Oxide Semiconductor Field Effect Transistor (MOSFET) exhibiting enhanced immunity to Hot Carrier Effects (HCEs), and a method by which the MOSFET may be formed. To form the MOSFET there is first provided a semiconductor substrate having a gate dielectric layer formed thereupon. The gate dielectric layer has a gate electrode formed thereupon, where the gate dielectric layer extends beyond a pair of opposite edges of the gate electrode. Formed into the semiconductor substrate adjoining the pair of opposite edges of the gate electrode is a pair of low dose ion implants. Formed upon the gate dielectric layer and contacting the pair of opposite edges of the gate electrode is a pair of conductive spacers. The pair of conductive spacers partially overlaps the pair of low dose ion implants. Finally, there is formed into the semiconductor substrate adjoining the pair of opposite edges of the gate electrode and further removed from the pair of conductive spacers a pair of source/drain electrodes. The pair of source/drain electrodes partially overlaps the pair of low dose ion implants. Optionally, a pair of insulator spacers may be formed upon the pair of conductive spacers to adjust the partial overlap of the pair of source/drain electrodes and the pair of low dose ion implants.

9 Claims, 2 Drawing Sheets

METHOD FOR FORMING A METAL OXIDE SEMICONDUCTOR FIELD EFFECT TRANSISTOR (MOSFET) HAVING IMPROVED HOT CARRIER IMMUNITY

BACKGROUND OF THE INVENTION

1. Field of the Invention

The present invention relates generally to Metal Oxide Semiconductor Field Effect Transistors (MOSFETs) within integrated circuits. More particularly, the present invention relates to methods for forming MOSFETs within integrated circuits, which MOSFETs exhibit improved hot carrier immunity.

2. Description of the Related Art

Correlating with the increases in density of advanced integrated circuit devices within advanced integrated circuits, and the decreases in dimensions of those advanced integrated circuit devices, there has been a simultaneous evolution of novel effects which affect the performance of advanced integrated circuit devices within advanced integrated circuits. For example, within advanced integrated circuits within which are formed MOSFETs, a general category of novel effects is known as Short Channel Effects (SCEs). Short Channel Effects (SCEs) derive from several factors, including but not limited to: (1) the narrowing of the semiconductor channel beneath a gate oxide within an advanced MOSFET, and (2) the thinning of the gate oxide layer which resides beneath a gate electrode within a MOSFET.

One of the more prevalent Short Channel Effects (SCEs) is the Hot Carrier Effect (HCE). The Hot Carrier Effect (HCE) derives from increased electric fields at gate electrode edges in advanced MOSFETs. The Hot Carrier Effect (HCE) is typically encountered when the thickness of the gate oxide layer within a MOSFET has been reduced while the MOSFET operating voltage has remained constant. As a result of the increased electrical field, charge carriers are injected from the semiconductor substrate within and upon which is formed the MOSFET into the gate oxide layer of the MOSFET, where the charge carriers are captured by free electron states of the gate oxide material from which is formed the gate oxide layer. The Hot Carrier Effect (HCE) is typically manifested as increased subthreshold currents within the MOSFETs within which is present the Hot Carrier Effect (HCE).

There are several methods by which Hot Carrier Effects (HCEs) may be controlled in advanced MOSFETs. Included among these methods are: (1) reducing the MOSFET operating voltage, (2) increasing the gate oxide layer thickness within the MOSFET, and (3) incorporating a Lightly Doped Drain (LDD) ion implant structure into the semiconductor substrate upon which is formed the MOSFET. A Lightly Doped Drain (LDD) ion implant structure is formed into a portion of the semiconductor substrate which bridges the source/drain electrodes of the MOSFET to the gate electrode edges of the MOSFET, thus providing an electric field gradient less likely to accelerate charge carriers from the semiconductor substrate into the gate dielectric layer.

Of the methods outlined above, the use of the Lightly Doped Drain (LDD) ion implant structure to reduce the Hot Carrier Effect (HCE) has been most common within advanced MOSFETs. Although the use of Lightly Doped Drain (LDD) ion implant structures has provided MOSFETs with reduced susceptibility to Hot Carrier Effects (HCEs), the Hot Carrier Effect (HCE) is not necessarily completely eliminated within MOSFETs within which are incorporated Lightly Doped Drain (LDD) ion implant structures. Thus, it is desirable in the art to provide adjunct methods and structures which supplement Lightly Doped Drain (LDD) ion implant structures in controlling the Hot Carrier Effect (HCE) in advanced MOSFETs. It is towards that goal that the present invention is directed.

Although not necessarily related to the Hot Carrier Effect (HCE), various aspects of forming MOSFETs within integrated circuits are known within the art of integrated circuit manufacture. For example, Chi, in U.S Pat. No. 5,173,437 discloses a MOSFET, portions of which are formed simultaneously with a double layer polysilicon capacitor within an integrated circuit. In addition, Natsume, in U.S. Pat. No. 5,356,826 discloses a MOSFET, portions of which are formed simultaneously with a double layer polysilicon capacitor and a polysilicon resistor within an integrated circuit.

Desirable in the art are adjunct methods and structures which supplement Lightly Doped Drain (LDD) ion implant structures in controlling the Hot Carrier Effect (HCE) in advanced MOSFETs. Particularly desirable are adjunct methods and structures which assist in controlling the Hot Carrier Effect (HCE) within advanced MOSFETs while simultaneously facilitating formation of other integrated circuit devices, such as double layer polysilicon capacitors and polysilicon resistors, within the integrated circuit within which is formed the MOSFET having enhanced Hot Carrier Effect (HCE) immunity.

SUMMARY OF THE INVENTION

A first object of the present invention is to provide adjunct methods and structures which supplement Lightly Doped Drain (LDD) ion implant structures in controlling the Hot Carrier Effect (HCE) within advanced MOSFETs.

A second object of the present invention is to provide methods and structures in accord with the first object of the present invention, through which methods and structures there may be simultaneously facilitated formation of other integrated circuit devices within the integrated circuit within which is formed the advanced MOSFET having enhanced Hot Carrier Effect (HCE) immunity.

A third object of the present invention is to provide methods and structures in accord with the first object of the present invention and second object of the present invention, which methods and structures are also readily manufacturable.

In accord with the objects of the present invention, there is provided a MOSFET and a method by which that MOSFET may be formed, which MOSFET exhibits enhanced immunity to Hot Carrier Effects (HCEs). To form the MOSFET of the present invention there is first formed upon a semiconductor substrate a gate dielectric layer. The gate dielectric layer has a gate electrode formed thereupon. The gate dielectric layer extends beyond a pair of opposite edges of the gate electrode. Formed into the semiconductor substrate adjoining the pair of opposite edges of the gate electrode is a pair of low dose ion implants. Formed upon the gate dielectric layer and contacting the pair of opposite edges of the gate electrode is a pair of conductive spacers. The pair of conductive spacers partially overlaps the pair of low dose ion implants. Finally, there is formed into the semiconductor substrate adjoining the pair of opposite edges of the gate electrode and further removed from the pair of conductive spacers a pair of source/drain electrodes. The pair of source/drain electrodes partially overlaps the pair of low dose ion implants.

The present invention provides adjunct methods and structures which supplement Lightly Doped Drain (LDD) ion implant structures in controlling the Hot Carrier Effect (HCE) in advanced MOSFETs. The present invention provides a MOSFET having a pair of conductive spacers upon a gate dielectric layer, which pair of conductive spacers contacts a pair of opposite edges of the gate electrode of the MOSFET. The conductive spacers partially overlap a pair of low dose ion implants which are formed into the semiconductor substrate within and upon which is formed the MOSFET. The low dose ion implants comprise a Lightly Doped Drain (LDD) structure of the MOSFET. By partially overlapping the pair of low dose ion implants with the pair of conductive spacers, the electric field gradient between the gate electrode edges of the MOSFET and the low dose ion implants is reduced, thus forming a MOSFET with a higher immunity to Hot Carrier Effects (HCEs).

The methods and structures through which is formed the MOSFET of the present invention are readily manufacturable. The MOSFET of the present invention is formed employing methods which are otherwise known in the art of integrated circuit manufacture. The MOSFET of the present invention possesses the novel feature of a pair of conductive spacers which: (1) contact a pair of opposite edges of the gate electrode of the MOSFET, and (2) partially overlap a pair of low dose ion implants within the semiconductor substrate upon which is formed the MOSFET. Methods and materials through which insulator spacers may in general be formed are known in the art of integrated circuit manufacture. By analogy methods and materials through which may be formed conductive spacers are also readily manufacturable. The methods and materials through which are formed the conductive spacers also may be employed in facilitating formation of other conductive elements and devices within the integrated circuit within which is formed the MOSFET of the present invention.

BRIEF DESCRIPTION OF THE DRAWINGS

The accompanying drawings, which form a material part of this disclosure, show the following.

DESCRIPTION OF THE PREFERRED EMBODIMENT

The present invention provides a Metal Oxide Semiconductor Field Effect Transistor (MOSFET) and a method for forming that MOSFET, which MOSFET exhibits enhanced immunity to the Hot Carrier Effect (HCE). The MOSFET of the present invention exhibits enhanced immunity to the Hot Carrier Effect (HCE) by forming conductive spacers which simultaneously contact the gate electrode of the MOSFET of the present invention and overlap a pair of low dose ion implants within the semiconductor substrate upon which is formed the MOSFET of the present invention. The overlap of the conductive spacers and the low dose ion implants provides for electric field gradient reductions at the gate electrode edges, thus providing a higher immunity to injection of hot carriers from the semiconductor substrate into the gate dielectric layer of the MOSFET of the present invention.

The MOSFET of the present invention, and the method for forming the MOSFET of the present invention, may be employed in integrated circuits including but not limited to Dynamic Random Access Memory (DRAM) integrated circuits, Static Random Access Memory (SRAM) integrated circuits, Application Specific Integrated Circuits (ASICs) and integrated circuits having within their fabrications Bipolar Complementary Metal Oxide Semiconductor (BiCMOS) transistors. The method of the present invention has broad applicability in forming MOSFETs with enhanced hot carrier immunity within integrated circuits.

Figure 1:
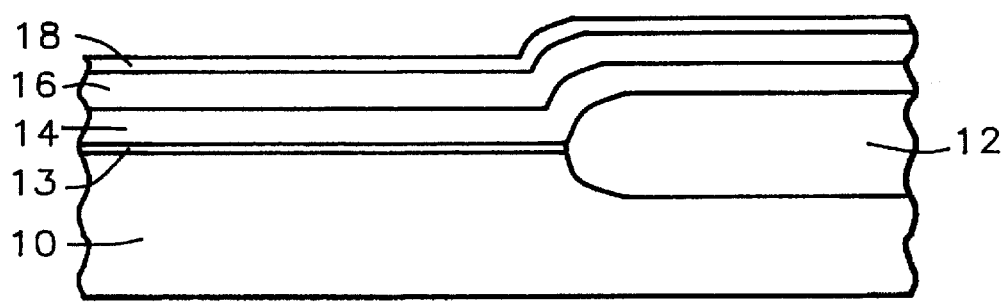
FIG. 1 to FIG. 5 show a series of schematic cross-sectional diagrams illustrating progressive stages in forming the MOSFET of the preferred embodiment of the present invention into an integrated circuit.

Referring now to FIG. 1 to FIG. 5 there is shown a series of schematic cross-sectional diagrams illustrating progressive stages in forming the MOSFET of the preferred embodiment of the present invention into an integrated circuit. Shown in FIG. 1 is the integrated circuit at early stages in its formation.

Shown in FIG. 1 is a semiconductor substrate 10 within and upon which is formed an isolation region 12 which defines the active region of the semiconductor substrate 10. Although the present invention may be practiced upon semiconductor substrates of either dopant polarity, various dopant concentrations and various crystallographic orientations, the semiconductor substrate 10 upon and within which is formed the MOSFET of the present invention will typically be a (100) silicon semiconductor substrate having a N- or P- doping.

Methods and materials through which may be formed isolation regions within and upon semiconductor substrates are known in the art. Isolation regions may be formed through methods including but not limited to thermal oxidation methods whereby portions of a semiconductor substrate exposed through a suitable oxidation mask are oxidized to form isolation regions, and isolation region deposition methods whereby a blanket layer of isolation material is formed upon a semiconductor substrate and subsequently patterned to form isolation regions. For the preferred embodiment of the present invention, the isolation region 12 is preferably formed through thermal oxidation at a temperature of from about 970 to about 990 degrees centigrade of a portion of the semiconductor substrate 10 exposed through a suitable oxidation mask to form the isolation region 12 of silicon oxide.

Also shown in FIG. 1 is the presence of a blanket gate dielectric layer 13 formed upon the active region of the semiconductor substrate 10. Blanket gate dielectric layers are known in the art of integrated circuit manufacture. Blanket gate dielectric layers may be formed through methods including but not limited to methods whereby the surface of an active region of a semiconductor substrate is oxidized to form a blanket gate dielectric layer and methods whereby blanket gate dielectric layers are independently deposited upon the surface of a semiconductor substrate. For the preferred embodiment of the present invention, the blanket gate dielectric layer 13 is preferably formed of a silicon oxide formed through thermal oxidation of the active region of the semiconductor substrate 10 at a temperature of from about 845 to about 855 degrees centigrade. Preferably, the blanket gate dielectric layer 13 is from about 110 to about 120 angstroms thick.

Also shown in FIG. 1 are three additional blanket layers formed upon the semiconductor substrate 10. The three layers are a blanket first polysilicon layer 14, a blanket metal silicide layer 16 and a blanket Inter Polysilicon Dielectric (IPD) layer 18. Each of these three blanket layers may be formed through methods and materials as are known in the art. In general, methods through which the preceding three blanket layers may be formed include but are not limited to Chemical Vapor Deposition (CVD) methods, Low Pressure Chemical Vapor Deposition (LPCVD) methods, thermal annealing methods and Physical Vapor Deposition (PVD) sputtering methods.

Although alternate methods and materials may be employed, the blanket first polysilicon layer 14 is preferably formed through a Chemical Vapor Deposition (CVD) method employing silane as the silicon source material. The blanket first polysilicon layer 14 is made conductive, preferably with a resistivity of no greater than about 45 ohms per square, through incorporation of a suitable amount of dopant, either simultaneously with or subsequent to forming the blanket first polysilicon layer 14. The dopant may be incorporated through ion implantation or Chemical Vapor Deposition (CVD) co-deposition methods as are known in the art. Preferably the thickness of the blanket first polysilicon layer 14 is from about 1350 to about 1550 angstroms.

Although it is known in the art that several metals may be employed in forming blanket metal silicide layers, including but not limited to titanium, tungsten, cobalt, tantalum and platinum, the blanket metal silicide layer 16 of the preferred embodiment of the present invention is preferably formed of tungsten silicide. Although several methods are in general know in the art of forming blanket metal silicide layers, the blanket metal silicide layer 16 of tungsten silicide is preferably formed through a Chemical Vapor Deposition (CVD) method through which tungsten silicide is deposited upon the blanket first polysilicon layer 14. Preferably the thickness of the blanket metal silicide layer 14 of tungsten silicide is from about 1050 to about 1450 angstroms.

Finally, there is shown in FIG. 1 the presence of a blanket Inter Polysilicon Dielectric (IPD) layer 18. In general, blanket Inter Polysilicon Dielectric (IPD) layers may be formed through several methods and dielectric materials as are known in the art, including but not limited to silicon oxide dielectric materials, silicon nitride dielectric materials and silicon oxynitride dielectric materials formed through methods including but not limited to Chemical Vapor Deposition (CVD) methods, Plasma Enhanced Chemical Vapor Deposition (PECVD) methods and Physical Vapor Deposition (PVD) sputtering methods. The blanket Inter Polysilicon Dielectric (IPD) 18 layer may be formed through any combination of these methods and materials. Preferably, the blanket Inter Polysilicon Dielectric (IPD) layer 18 is from about 340 to about 400 angstroms thick.

Figure 2:
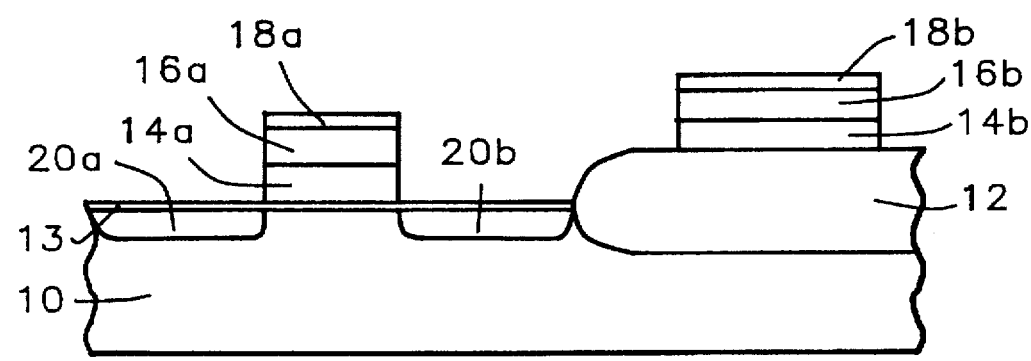

Referring now to FIG. 2, there is shown a schematic cross-sectional diagram illustrating the results of further processing of the integrated circuit whose structure is shown in FIG. 1. Shown in FIG. 2 is the results of patterning the blanket Inter Polysilicon Dielectric (IPD) layer 18, the blanket metal silicide layer 16 and the blanket first polysilicon layer 14 to yield a first patterned stack upon the active region of the semiconductor substrate 10 and a second patterned stack upon the isolation region 12.

The first patterned stack consists of the patterned Inter Polysilicon Dielectric (IPD) layer 18a, the patterned metal silicide layer 16a and the patterned first polysilicon layer 14a. Together, the patterned metal silicide layer 16a and the patterned first polysilicon layer 14a form a polycide gate electrode within the MOSFET of the preferred embodiment of the present invention. The polycide gate electrode has a thickness of from about 2400 to about 3100 angstroms. The second patterned stack consists of the patterned Inter Polysilicon Dielectric (IPD) layer 18b, the patterned metal silicide layer 16b and the patterned first polysilicon layer 14b. Together, the patterned metal silicide layer 16b and the patterned polysilicon layer 14b form a first polysilicon capacitor electrode of a double layer polysilicon capacitor which is formed upon the isolation region 12. The patterned Inter Polysilicon Dielectric (IPD) layer 18b is employed in forming the dielectric layer within the double layer polysilicon capacitor. As is understood by a person skilled in the art, an operational gate electrode and first polysilicon capacitor electrode may also be formed from alternative polycides, as well as doped polysilicon, by alternative choices of metals in forming the blanket metal silicide layer 16, or by the absence of the blanket metal silicide layer 16.

The patterning by which is formed the first patterned stack and the second patterned stack may be accomplished through photolithographic and etching methods as are known in the art. Preferably, although not exclusively, the blanket Inter Polysilicon Dielectric (IPD) layer 18 will be photolithographically patterned to form the patterned Inter Polysilicon Dielectric (IPD) layers 18a and 18b, and the patterned Inter Polysilicon Dielectric (IPD) layers 18a and 18b will be employed in patterning the blanket metal silicide layer 16 and the blanket first polysilicon layer 14. Under such circumstances, the blanket gate dielectric layer 13 typically serves as an etch stop. Typically, although not exclusively, Reactive Ion Etch (RIE) etch methods are employed.

Also shown in FIG. 2 is the presence of low dose ion implants 20a and 20b formed into the active region of the semiconductor substrate 10 at areas not occupied by the first patterned stack. The low dose ion implants 20a and 20b are implanted by means of ion implant methods as are known in the art. The low dose ion implants 20a and 20b are preferably implanted through the exposed portions of the blanket gate dielectric layer 13. The low dose ion implants 20a and 20b are typical in the art of forming Lightly Doped Drain (LDD) ion implant structures within MOSFETs. As is understood by a person skilled in the art, the desired polarity of the MOSFET will dictate the polarity of dopant employed in forming the low dose ion implants 20a and 20b. Boron and phosphorus dopants are common in the art of low dose ion implants. Preferably, the low dose ion implants 20a and 20b are formed at an ion implant dose of from about 1.0E13 to about 4.0E13 ions per square centimeter and an ion implant energy of from about 40 to about 60 keV.

Figure 3:
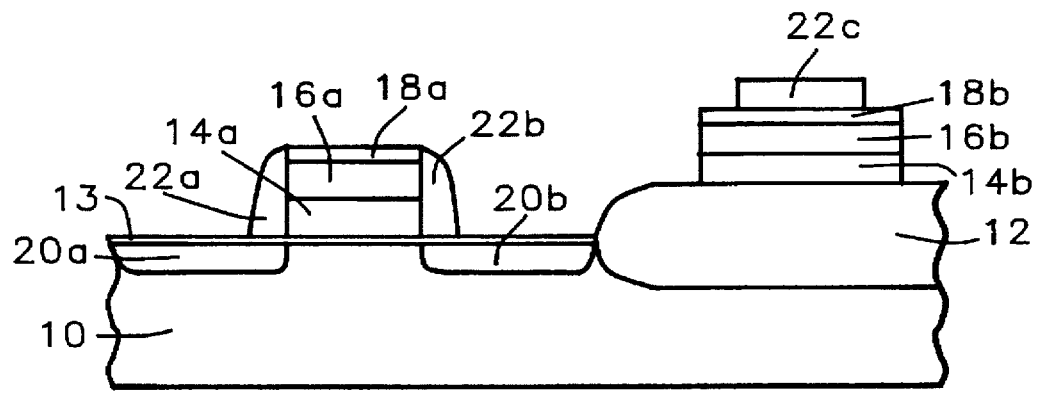

Referring now to FIG. 3 there is shown a schematic cross-sectional diagram illustrating the results of further processing of the integrated circuit whose structure is illustrated in FIG. 2. Shown in FIG. 3 is the presence of conductive spacers 22a and 22b which contact the pair of opposite edges of the polycide gate electrode adjoining which pair of opposite edges are formed the low dose ion implants 20a and 20b. Also shown in FIG. 3 is the presence of the second polysilicon capacitor electrode 22c, which resides upon the surface of the patterned Inter Polysilicon Dielectric (IPD) layer 18b. Although the conductive spacers 22a and 22b need not necessarily be formed from the same material from which is formed the second polysilicon capacitor electrode 22c, there is manufacturing efficiency when the conductive spacers 22a and 22b are formed from the same material from which is formed the second polysilicon capacitor electrode 22c. Although the conductive spacers 22a and 22b, and the second polysilicon capacitor electrode 22c, may in general be formed of several conductive materials, including but not limited to metals, metal alloys and doped polysilicon, the conductive spacers 22a and 22b, and the second polysilicon capacitor electrode 22c are preferably formed of doped polysilicon.

Analogously to the method by which are formed the patterned first polysilicon layers 14a and 14b, the conductive spacers 22a and 22b, and the second polysilicon capacitor electrode 22c, are preferably formed from a blanket second polysilicon layer formed upon the surface of the semiconductor substrate 10. However, the method by which are formed the conductive spacers 22a and 22b, and the second polysilicon capacitor electrode 22c, preferably involves a photolithographic method which involves masking of only the surface of the blanket second polysilicon layer beneath which is formed the second polysilicon capacitor electrode 22c, followed by anisotropic etching of the blanket second polysilicon layer to leave remaining the conductive spacers 22a and 22c and the second polysilicon capacitor electrode 22c. The anisotropic etching is typically, although not exclusively, accomplished through a Reactive Ion Etch (RIE) etch method.

The thickness of the blanket second polysilicon layer from which is formed the conductive spacers 22a and 22b, and the second polysilicon capacitor electrode 22c, is preferably from about 2400 to about 3000 angstroms. Preferably, the blanket second polysilicon layer is made conductive through incorporation of dopants through methods and materials analogous to the methods and materials employed in doping the blanket first polysilicon layer 14. Preferably, the blanket second polysilicon layer has a resistivity of no greater than about 30 ohms per square. Preferably, the thicknesses of the conductive spacers 22a and 22b upon the blanket gate dielectric layer are from about 1300 to about 1700 angstroms each. This provides a partial overlap of the conductive spacer 22a over the low dose ion implant 20a and a partial overlap of conductive spacer 22b over low dose ion implant 20b of from about 1300 to about 1700 angstroms each.

Figure 4:
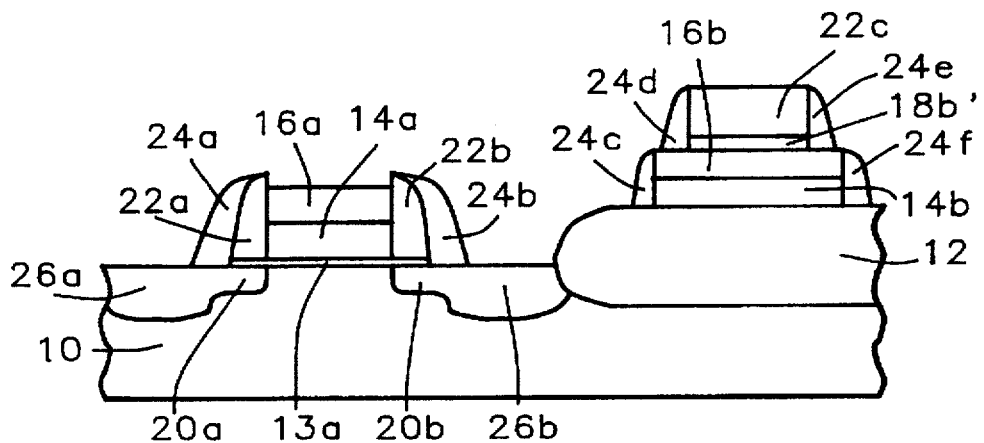

Referring now to FIG. 4, there is shown a schematic cross-sectional diagram illustrating the results of further stages in the processing of the integrated circuit whose structure is illustrated in FIG. 3. Shown in FIG. 4 is the presence of: (1) insulator spacers 24a and 24b formed upon the surfaces of conductive spacers 22a and 22b, respectively, (2) insulator spacers 24c and 24f formed adjoining the first polysilicon capacitor electrode formed of patterned first polysilicon layer 14b and patterned metal silicide layer 16b, and (3) insulator spacers 24d and 24e formed adjoining the second polysilicon capacitor electrode 22c and an etched patterned Inter Polysilicon Dielectric (IPD) layer 18b'.

Although an alternative ordering of process steps is feasible to achieve an integrated circuit structure similar and functionally equivalent to the integrated circuit structure illustrated in FIG. 4, the preferred embodiment of the method of the present invention first provides that the patterned Inter Polysilicon Dielectric (IPD) layer 18a and exposed portions of the patterned Inter Polysilicon Dielectric (IPD) layer 18b are removed from the integrated circuit along with exposed portions of the blanket gate dielectric layer 13. The patterned Inter Polysilicon Dielectric (IPD) layer 18a is completely removed. Removal of exposed portions of the patterned Inter Polysilicon Dielectric (IPD) layer 18b leaves remaining the etched patterned Inter Polysilicon Dielectric (IPD) layer 18b'. Removal of exposed portions of the blanket gate dielectric layer 13 leaves remaining the patterned gate dielectric layer 13a. Methods and materials through which the preceding three dielectric layers may be etched are known in the art. Such methods and materials include but are not limited to wet chemical etch methods and dry plasma Reactive Ion Etch (RIE) etch methods employing etchant materials suitable to the dielectric materials from which are formed the dielectric layers.

Subsequent to removing the patterned Inter Polysilicon Dielectric (IPD) layer 18a, and exposed portions of the patterned Inter Polysilicon Dielectric Layer 18b and the blanket gate oxide layer 13, the insulator spacers 24a, 24b, 24c, 24d, 24e and 24f are formed. The method through which the insulator spacers 24a, 24b, 24c, 24d, 24e and 24f are formed is analogous to the method through which are formed the conductive spacers 22a and 22b. However, the material from which is formed the insulator spacers 24a, 24b, 24c, 24d, 24e and 24f is substantially different. As is known in the art, insulator spacers may be formed from insulator materials including but not limited to silicon oxide insulator materials, silicon nitride insulator materials and silicon oxynitride insulator materials. Analogously to the conductor spacers 22a and 22b, the insulator spacers 24a, 24b, 24c, 24d, 24e and 24f are formed through anisotropic etching of a blanket layer of insulator material formed upon the surface of the semiconductor substrate 10. The blanket layer of insulator material may be formed from a silicon oxide insulator material, a silicon nitride insulator material or a silicon oxynitride insulator material. The insulator spacer 24a provides an additional partial overlap of the low dose ion implant 20a. The insulator spacer 24b provides an additional partial overlap of the low dose ion implant 20b. Preferably, the insulator spacers 24a and 24b have a thickness upon the surface of the semiconductor substrate 10 (and an overlap of their respective low dose ion implants) of from about 1300 to about 1500 angstroms each. Although a MOSFET with increased immunity to hot carriers may be formed through the method of the present invention absent the insulator spacers 24a and 24b (ie: with the presence only of the conductive spacers 22a and 22b), the presence of insulator spacers 24a and 24b is preferred since they provide a structure which yields a lower electric field gradient through which hot carriers may be accelerated.

Finally, there is shown in FIG. 4 the presence of source/drain electrodes 26a and 26b formed into exposed portions of the semiconductor substrate 10 adjoining the insulator spacers 24a and 24b, and the isolation region 12. Methods and materials through which may be formed source/drain electrodes are known in the art of MOSFET fabrication. Such methods and materials follow analogously from the ion implantation methods and materials through which are formed low dose ion implants within MOSFETs. The polarity of low dose ion implants will dictate the polarity of the source/drain electrodes. Arsenic dopant atoms, phosphorus dopant atoms and boron dopant atoms are common in forming source/drain electrodes. For the preferred embodiment of the present invention, the source/drain electrodes 26a and 26b are formed of polarity equivalent to the corresponding low dose ion implants 20a and 20b, through ion implantation of a suitable dopant at a preferred ion implant dose of about 3.0E15 to about 5.0E15 ions per square centimeter and a preferred ion implant energy of from about 40 to about 60 keV.

Figure 5:
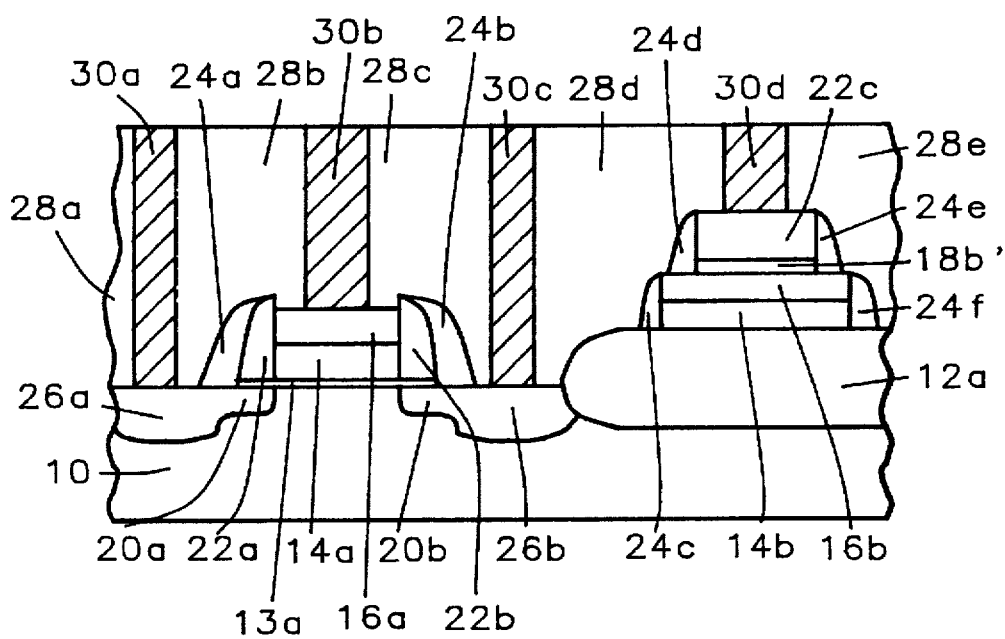

Referring now to FIG. 5 there is shown a cross-sectional schematic diagram illustrating the results of the last series of process steps in forming the preferred embodiment of the MOSFET of the present invention. Shown in FIG. 5 is the presence of patterned planarized Pre-Metal Dielectric (PMD) layers 28a, 28b, 28c, 28d and 28e. Methods and materials through which Pre-Metal Dielectric (PMD) layers may be formed, planarized and patterned within integrated circuits are known in the art. Pre-Metal Dielectric (PMD) layers may be formed of dielectric materials including but not limited to silicon oxide dielectric materials, silicon nitride dielectric materials and silicon oxynitride dielectric materials deposited within integrated circuits through methods including but not limited to Chemical Vapor Deposition (CVD) methods, Plasma Enhanced Chemical Vapor Deposition (PECVD) methods and Physical Vapor Deposition (PVD) sputtering methods. Subsequent to forming such Pre-Metal Dielectric (PMD) layers, they may be planarized through Reactive Ion Etch (RIE) etch planarizing methods and Chemical Mechanical Polish (CMP) planarizing methods as are known in the art. Subsequent to planarizing such Pre-Metal Dielectric (PMD) layers they may be patterned through photolithographic and etch methods as are common in the art.

For the preferred embodiment of the present invention, the patterned planarized Pre-Metal Dielectric (PMD) layers 28a, 28b, 28c, 28d and 28e are preferably formed of a silicon oxide dielectric material, as is common in the art. The patterned planarized Pre-Metal Dielectric (PMD) layers 28a, 28b, 28c, 28d and 28e are planarized and subsequently patterned until there is reached the surfaces of the source/drain electrode 26a, the patterned metal silicide layer 16a, the source/drain electrode 26b and the second polysilicon capacitor electrode 22c.

Finally, there is shown in FIG. 5 the presence of conductive contact studs 30a, 30b, 30c and 30d which are formed into the apertures between the patterned planarized Pre-Metal Dielectric (PMD) layers 28a, 28b, 28c, 28d and 28e. The conductive contact studs 30a, 30b, 30c and 30d make contact, respectively, with the source/drain electrode 26a, the patterned metal silicide layer 16a, the source/drain electrode 26b and the second polysilicon capacitor electrode 22c. Methods and materials through which conductive contact studs may be formed within integrated circuits are known in the art. Conductive contact studs may be formed through methods including but not limited to thermal evaporation methods, electron beam assisted evaporation methods and Chemical Vapor Deposition (CVD) methods through which may be formed conductive contact studs of conductive materials including but not limited to metals, metal alloys and doped polysilicon. For the preferred embodiment of the present invention, the conductive contact studs 30a, 30b, 30c and 30d are preferably formed of tungsten metal deposited through a Chemical Vapor Deposition (CVD) method, as is common in the art. The conductive contact studs 30a, 30b, 30c and 30d are formed of a sufficient thickness to reach the upper surfaces of the patterned planarized Pre-Metal Dielectric layers 28a, 28b, 28c, 28d and 28e.

Upon forming the conductive contact studs 30a, 30b, 30c and 30d, there is formed the MOSFET of the preferred embodiment of the present invention within an integrated circuit. The MOSFET so formed has an enhanced immunity to Hot Carrier Effects (HCEs). The enhanced hot carrier immunity of the MOSFET results from the presence of the pair of conductive spacers and the optional pair of insulator spacers which partially overlap the pair of low dose ion implants which are employed in forming a Lightly Doped Drain (LDD) structure within the MOSFET of the present invention. The overlap of these spacers provides for reductions in electric field gradients between the gate electrode edges and the source/drain electrodes of the MOSFET of the present invention.

As is understood by a person skilled in the art, the MOSFET of the preferred embodiment of the present invention is illustrative of the present invention rather than limiting of the present invention. Revisions may be made to methods, materials, structures and dimensions through which is formed the MOSFET of the preferred embodiment of the present invention while still forming a MOSFET which is within the spirit and scope of the present invention.

What is claimed is:

1. A method for fabricating a Metal Oxide Semiconductor Field Effect Transistor (MOSFET) comprising:

forming upon a semiconductor substrate a gate dielectric layer, the gate dielectric layer having a gate electrode formed thereupon, the gate dielectric layer extending beyond a pair of opposite edges of the gate electrode, the gate electrode layer being formed at least in part from a first doped polysilicon layer;

forming into the semiconductor substrate directly adjoining the pair of opposite edges of the gate electrode a pair of low dose ion implants;

forming upon the gate dielectric layer and contacting the pair of opposite edges of the gate electrode a pair of conductive spacers, the pair of conductive spacers partially overlapping the pair of low dose ion implants, the pair of conductive spacers being formed from a second doped polysilicon layer; and forming into the semiconductor substrate adjoining the pair of opposite edges of the gate electrode and further removed from the pair of conductive spacers a pair of source/drain electrodes, the pair of source/drain electrodes partially overlapping the pair of low dose ion implants, where at least either;

the first doped polysilicon layer is employed in forming over the semiconductor substrate, simultaneously with the gate electrode, a first polysilicon capacitor electrode within a double layer polysilicon capacitor; or the second doped polysilicon layer is employed in forming over the semiconductor substrate, simultaneously with the pair of conductive spacers, a second polysilicon capacitor electrode within the double layer polysilicon capacitor.

2. The method of claim 1 wherein the thickness of the gate electrode is from about 2400 to about 3100 angstroms.

3. The method of claim 1 wherein the gate electrode is formed from a polycide.

4. The method of claim 1 wherein the first doped polysilicon layer which has a resistivity of no greater than about 45 ohms per square.

5. The method of claim 1 wherein the pair of low dose ion implants is formed at an ion implant dose of from about 1.0E13 to about 4.0E13 ions per square centimeter and an ion implantation energy of from about 40 to about 60 keV.

6. The method of claim 1 wherein the second doped polysilicon layer has a resistivity of no greater than about 30 ohms per square.

7. The method of claim 1 wherein each conductive spacer within the pair of conductive spacers overlaps a low dose ion implant within the pair of low dose ion implants by a width of about 1300 to about 1700 angstroms upon the semiconductor substrate.

8. The method of claim 1 wherein the pair of source/drain electrodes is formed at an ion implant dose of from about 3.0E15 to about 5.0E15 ions per square centimeter and an ion implantation energy of from about 40 to about 60 keV.

9. The method of claim 1 further comprising forming a pair of insulator spacers upon the pair of conductive spacers, each insulator spacer within the pair of insulator spacers further overlapping a low dose ion implant within the pair of low dose ion implants by a thickness of from about 1300 to about 1500 angstroms upon the semiconductor substrate.

* * * * *